United States Patent [19]

Burns

[11] 4,260,670
[45] Apr. 7, 1981

[54] X-RAY MASK

[75] Inventor: John A. Burns, New Hope, Pa.

[73] Assignee: Western Electric Company, Inc., New York, N.Y.

[21] Appl. No.: 57,065

[22] Filed: Jul. 12, 1979

[51] Int. Cl.³ .................. F24F 13/00; G21F 3/02; G21K 3/00; G02B 5/00
[52] U.S. Cl. .................................. 430/5; 250/505; 250/510; 430/967
[58] Field of Search .................. 430/5, 967, 966; 250/505, 510

[56] References Cited

U.S. PATENT DOCUMENTS

| | | | |
|---|---|---|---|
| 2,624,013 | 12/1952 | Marks | 250/505 |
| 3,742,229 | 6/1973 | Smith et al. | 250/65 R |
| 3,742,230 | 6/1973 | Spears et al. | 250/65 R |
| 3,873,824 | 3/1975 | Bean et al. | 250/505 |
| 3,892,973 | 7/1975 | Coquin et al. | 250/505 |
| 4,021,276 | 5/1977 | Cho et al. | 156/644 |
| 4,037,111 | 7/1977 | Coquin et al. | 250/505 |
| 4,080,267 | 3/1978 | Castellani et al. | 204/15 |
| 4,088,896 | 5/1978 | Elkins et al. | 250/505 |

OTHER PUBLICATIONS

"X-ray Lithography for IC Processing", Hughes, *Solid State Techn.*, 5/1977 pp. 39 et seq.
"High Speed . . . X-ray Lithography", Maydon et al., *IEEE Transactions*, 7/1975 pp. 429 et seq.
"X-ray Lithography", Watts, *Solid State Techn.*, 5/1979, pp. 68 et seq.
"X-ray Lithography Technology Update", Wardly, *Semiconductor Fabrication*, 1/1978, pp. 30 et seq.

*Primary Examiner*—Richard L. Schilling
*Attorney, Agent, or Firm*—D. J. Kirk

[57] ABSTRACT

An X-ray transparent mask (51) is comprised of a support ring (42) with a planar substrate stabilizer (41) thereon, the stabilizer having a plurality of apertures (43) therethrough, arranged in a "checkerboard" fashion. A thin X-ray transparent mask substrate (52) is placed over the stabilizer (41), the substrate having X-ray absorptive metallized patterns (53) thereon which are aligned with the apertures (43). The mask (51) is positioned proximate a semiconductor wafer (56) having a photoresist coating (30) thereon. X-rays (14) are directed at the photoresist coating (30) through the apertures (43) to selectively expose the coating. The mask (51) is then indexed one aperture position and the remaining portion of coating (30) is exposed to the X-rays (14).

4 Claims, 6 Drawing Figures

PRIOR ART

X-RAY MASK

TECHNICAL FIELD

The instant invention is related to the fabrication of micro-miniature devices. In particular, the invention is directed to apparatus for exposing resist-coated substrates to X-rays during the fabrication of semiconductor circuits.

BACKGROUND OF THE INVENTION

It is well known to fabricate micro-miniature electronic devices in semiconductor material using conventional photolithographic techniques. The resolution capabilities of such standard techniques are limited by interference and diffraction effects that are directly related to the wavelength of the light employed in the photolithographic process. With the advent of the higher density of very large scale integrated circuits, the need arises for sub-micron line widths. However, in practice, the minimum line width which can be accurately replicated by conventional photolithographic printing is 1 to 2 microns. Moreover, to achieve such resolution, intimate contact may be required between a mask and a semiconductor wafer, which, in time, results in physical damage to the wafer and/or mask.

Higher resolution (sub-micron) pattern definition in device fabrication can be achieved with scanning electron beam lithography. However, a fully versatile electron beam exposure system is an expensive and complex installation. Additionally, in such a system, it is necessary that each pattern of each device be exposed in a sequential point-by-point manner in a program-controlled system. Such a procedure is relatively time consuming and expensive.

Accordingly, it has been proposed that a scanning electron beam be used only to generate high-resolution master masks and replication of the mask patterns onto wafers would then be done in some other manner. Soft X-ray exposure systems have been used to replicate the required sub-micron line widths. However, masks to be used in such systems require that the X-ray transparent portions thereof be extremely thin (e.g., 5 to 10 microns) resulting in fragile and dimensionally unstable masks.

U.S. Pat. No. 3,892,973 to Coquin et al. describes a particular mask structure for use in an X-ray lithography system. A thin X-ray transparent film is stretched over and bonded to a support ring and an X-ray absorptive pattern formed thereon. The mask is then positioned proximate a resist-coated wafer and illuminated with X-rays to form a shadow pattern on the resist layer defined by the X-ray absorptive pattern on the thin film. Such a technique has been found to be most effective where only a single mask is required. However, where multiple masking operations at different levels are required, as in the fabrication of a typical integrated circuit, difficulties arise in maintaining registration between mask levels due to dimensional instabilities in each mask.

U.S. Pat. No. 3,742,230 to Spears et al. is directed to a soft X-ray mask having an X-ray opaque support substrate. The support substrate has a plurality of relatively thick webs arranged in a grid fashion to provide support for an X-ray transparent membrane. However, the webs undesirably prevent the exposure of substantial portions of the circuit sites on the semiconductor wafer and such a mask arrangement can be relatively weak in a shear mode when the mask diameter is greater than three inches.

Accordingly, there exists a need for methods and means to expose large diameter wafers to X-ray radiation through a series of masking steps where a number of such masks must register accurately between masking levels while maintaining line width definition in the sub-micron range.

SUMMARY OF THE INVENTION

The instant invention overcomes the foregoing problem with an X-ray mask, comprising an X-ray opaque substrate stabilizer having a plurality of apertures therethrough arranged in a checkerboard fashion; and a mask substrate, transparent to X-ray radiation having X-ray absorptive patterns thereon, in intimate contact with the stabilizer with the patterns aligned with the apertures.

DETAILED DESCRIPTION

Figure 1:
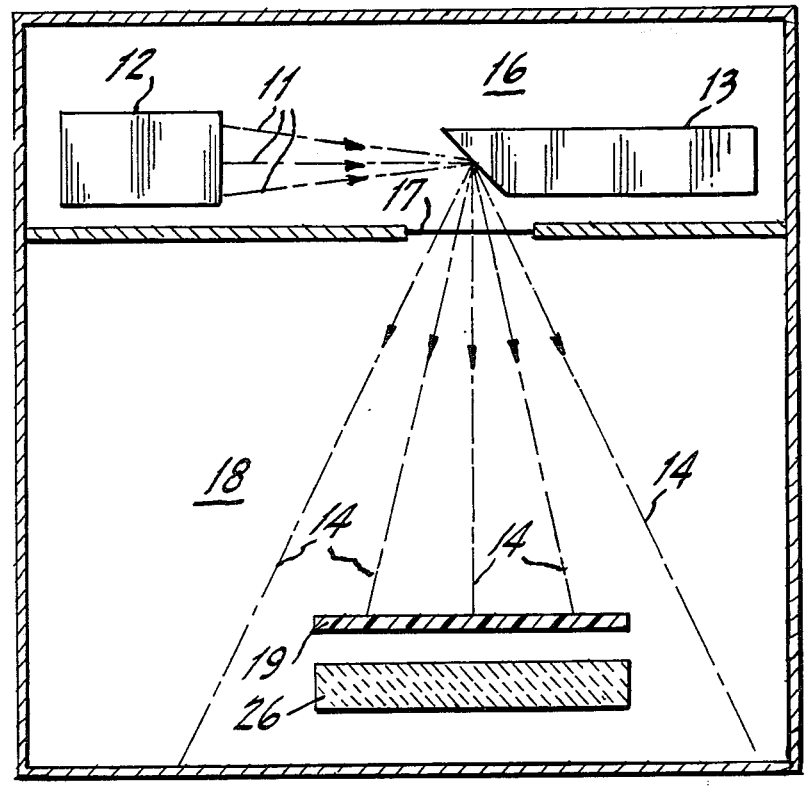
FIG. 1 is a schematic representation of a prior art X-ray lithographic system.

FIG. 1 depicts a conventional prior art X-ray lithographic system. A beam of electrons 11 supplied by an electron source 12 is directed at a water cooled X-ray target 13. In response to the incident beam of electrons 11, the target 13 emits X-rays indicated by the broken lines 14—14. Illustratively, the X-rays 14—14 so emitted are of the so-called soft type having characteristic wavelengths in the range from approximately 4 to 9 Angstroms. The target 13 may be made of X-ray emissive material such a aluminum, silicon, molybdenum, rhodium or the like.

The electron source 12 and the target 13 are enclosed in a high-vacuum compartment 16. X-rays 14—14 emitted from the target 13 pass through an X-ray transparent window 17 (e.g., beryllium) into a lower-vacuum working chamber 18 which contains a mask 19 and a resist-coated wafer 26 mounted in spaced relation.

Soft X-rays suffer far less from diffraction than does ultra-violet light, making possible non-contact exposure with the mask 19 several microns or more away from the wafer 26, thereby avoiding mechanical damage from particulate contamination and hillock growth on a hot, processed wafer.

Figure 2:
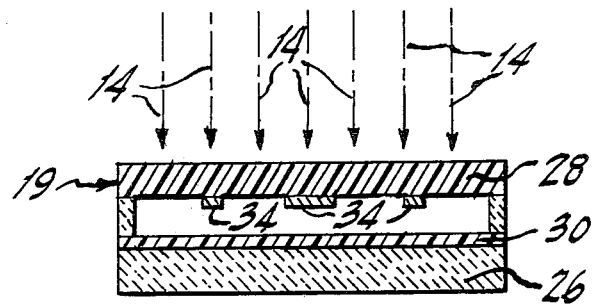
FIG. 2 is a cross-sectional view of a prior art mask and associated wafer used in implementing the system depicted in FIG. 1.

FIG. 2 shows a detailed cross-sectional view of the mask 19 and the resist-coated wafer 26 shown in FIG. 1. In FIG. 2, an X-ray transparent mask substrate 28 is shown in spaced relation from an X-ray radiation sensitive polymer resist coating 30 on the wafer 26. X-ray absorptive elements 34—34, definitive of a predetermined pattern to be formed in the coating 30, may be gold, platinum or the like. The formation process for the elements 34—34 may comprise, for example, standard electron beam lithographic techniques followed by conventional ion milling.

Irradiation by the X-rays 14—14 of the mask 19, as shown in FIG. 2, causes the radiation-sensitive resist coating 30 to be selectively exposed in accordance with the pattern defined by the absorptive elements 34—34. Areas of the coating 30 shadowed by the elements 34—34 are not exposed to the incident X-rays 14—14. In the exposed areas of the coating 30, either polymer crosslinking or polymer chain scission occurs depending, respectively, on whether the resist coating is of the negative or positive type. In the case of a negative resist, a developing solvent is utilized to remove the unexposed polymer, whereas in the case of a positive resist, the exposed polymer is removed. Subsequently, in accordance with standard techniques known in the art, materials may be deposited directly on the surface of the wafer 26 in those regions where the coating 30 has been removed. Or if, for example, an oxide layer had been previously formed directly on the wafer 26 below the coating 30, those portions of the oxide layer from which the coating 30 has been removed can then be selectively treated by chemical techniques, by ion milling or the like.

Various mask structures have been used to implement the aforementioned X-ray lithographic techniques, the above-referred to Coquin et al. mask being a particularly effective approach for masking small diameter wafers on a single level. The present invention is directed to a large diameter mask providing line widths in the sub-micron range. In addition, the instant technique provides a mask having a high degree of dimensional stability required when a set of such masks (e.g., 5 to 8) are used to fabricate an integrated circuit on silicon and the masks must register within approximately one tenth of a micron over a 4 inch diameter wafer.

Figure 3:
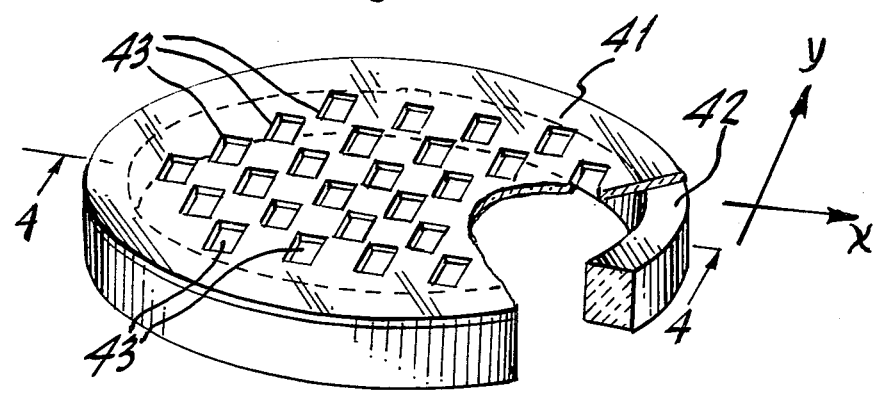
FIG. 3 is an isometric view of a substrate stabilizer and support ring.

FIG. 3 depicts a planar X-ray opaque mask substrate stabilizer 41 fixedly mounted on a support ring 42. There are a multitude of apertures 43—43 formed in a "checkerboard" pattern in the substrate stabilizer 41. In other words, approximately one-half of the surface of the substrate stabilizer 41 has apertures 43—43 extending therethrough in alternating order. Accordingly, the strength and stability provided by the mask substrate stabilizer 41 is superior to mask stabilizers having the apertures 43—43 closely spaced over the full surface of the substrate 41 with little support between apertures.

Figure 4:
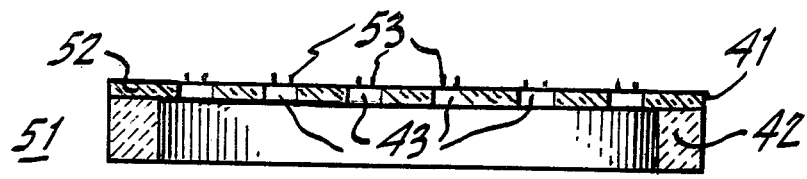
FIG. 4 is a cross-sectional view of an X-ray mask incorporating the instant inventive concepts.

FIG. 4 shows a cross section of a fully fabricated X-ray mask generally designated by the numeral 51. The mask may be fabricated by using a silicon wafer, typicaly 0.025 of an inch thick, as a substrate stabilizer 41. A coating, approximately 5 to 10 microns thick, which will become the mask substrate 52, is applied by either: (a) chemically vapor depositing (CVD) Boron Nitride, Tungsten Carbide, Silicon Nitride, Silicon Dioxide or other such material having good X-ray transparency to the particular X-ray wavelength soruce, or (b) spinning a thin polymer type coating (e.g., polyimide) onto the silicon surface and curing the polymer. The coating is then metallized with X-ray absorbing material (e.g., evaporate, sputter or plate gold). The non-metallized side of the silicon wafer is then coated with photoresist which is then exposed and developed in a predetermined pattern (e.g., "checkboard"). The photoresist is also exposed and developed at the periphery of the wafer to form an annular border of uncoated silicon. The wafer is then epoxy bonded to the support ring 42 at the annular border. The support ring 42 may be a Pyrex material. The back side of the silicon wafer is then etched down to the mask substrate 52 to form the apertures 43—43. An E-beam photoresist, such as Polymethyl Methacrylate, is then applied to the metallized side of the wafer and finally the metallization pattern 53 formed thereon.

An alternative method of forming the X-ray mask 51 would be to applique a plastic film to an apertured metallic substrate stabilizer 41. Such a technique may be implemented by using a high stability metal, such as that sold under the tradename Invar, for the substrate stabilizer 41 in which the checkered array of apertures 43—43 are etched using conventional photolithographic or machining techniques. The stabilizer 41 is then fixedly attached to the support ring 42 by brazing, epoxy bonding or the like. The mask substrate 52 (Kapton, Mylar, or similar type films) is then attached to the substrate stabilizer 41 by applying an epoxy adhesive to the stabilizer, stretching substrate 52 material thereover and curing the adhesive. The substrate 52 is then metallized with an X-ray absorbing metal (e.g., gold) and the desired patterns generated on the film in alignment with the apertures 43—43 by using well known photolithographic or electron beam techniques.

An X-ray transparent protective layer (not shown) of material may be deposited over the X-ray absorptive patterns. Materials such as sputtered boron carbide, thin metallic films such as aluminum or beryllium, optically transparent materials such as indium oxide, tin oxide and silicon oxide as well as a variety of monomer and polymer plastic coatings may be used.

Figure 5:
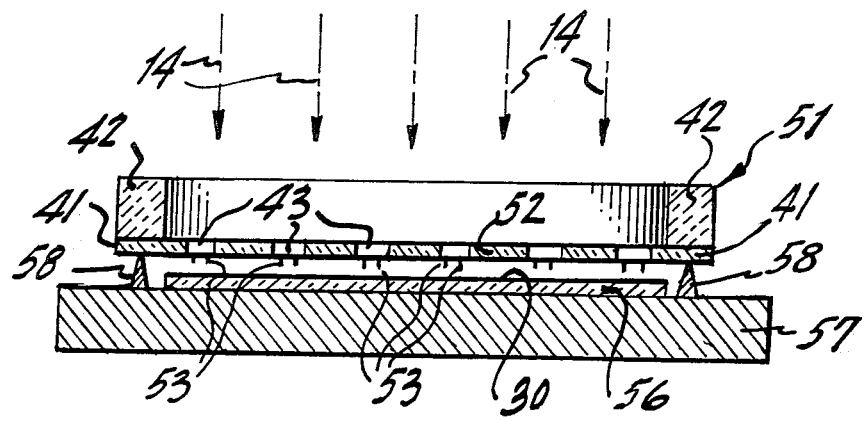
FIG. 5 is a partial cross-sectional view of the instant mask being used in exposing a resist-coated substrate to X-ray radiation.
Figure 6:
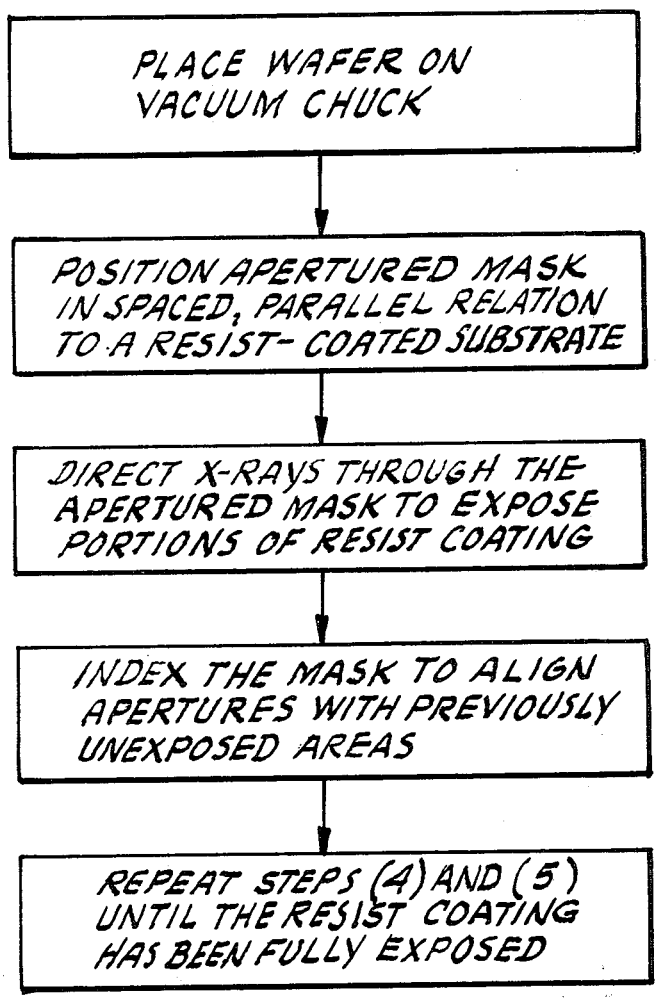
FIG. 6 is a block diagram depicting the steps for selectively exposing the resist coating on a wafer.

In operation (see FIGS. 5 and 6), a semiconductor wafer 56, having a photoresist coating 30 thereon, is placed on a vacuum chuck 57 which holds the wafer securely in place. A plurality of spacers 58—58 are located on the chuck 57 in spaced relation to the peripheryu of the wafer 56. The mask 51 is then placed on the spacers 58—58, as shown in FIG. 5, with the metallization pattern 53 in spaced relation to the wafer 56. X-rays 14—14 are then directed towards the mask 51 and pass through the apertures 43—43 and the X-ray transparent film 52 onto the photoresist 30. The X-rays 14—14 impinging on the metallization pattern 53—53 will either be absorbed or backscattered by the metal and a shadow of the pattern will be formed in the photoresist 30. When a mask 51 with a substrate stabilizer 41 having a "checkerboard" pattern as shown in FIG. 3 is used, the mask must be indexed one aperture position in the x or y direction and then be re-exposed to the X-rays 14—14 in order to permit exposure of substantially the entire wafer. Clearly, if only a limited number of devices are required, the initial exposure of one-half the surface of the wafer may suffice.

Although the exemplary embodiment depicts the use of square or rectangular apertures, it should be clear that the present invention is not so limited for other geometric forms such as circular, triangular, etc. could be used depending on the area to be irradiated and the dimensional stability required of the mask.

Additionally, the use of a "checkerboard" pattern is most advantageous in that the resist 30 may be exposed using only two steps. However, if time permits, other patterns such as a single row of apertures may be used with a plurality of sequential indexing and exposing steps to fully expose the resist coating 30.

What is claimed is:

1. An X-ray mask, comprising:

an X-ray opaque substrate stabilizer having a plurality of apertures therethrough arranged in a checkerboard fashion; and a mask substrate, transparent to X-ray radiation having X-ray absorptive patterns thereon, in intimate contact with the stabilizer with the patterns aligned with the apertures.

2. The X-ray mask as set forth in claim 1, wherein: the mask substrate is a thin X-ray transparent membrane.

3. The X-ray mask as set forth in claim 1, wherein: the absorptive patterns on the mask substrate have an X-ray transparent coating thereon.

4. The X-ray mask as set forth in claim 1, characterized by:
means for supporting the substrate stabilizer about the periphery thereof.

* * * * *